(12) United States Patent
Pantoja

(10) Patent No.: US 12,721,103 B2
(45) Date of Patent: Aug. 25, 2026

(54) SEMICONDUCTOR DEVICE HAVING A DETACHABLE FOIL, POWER ELECTRONICS ARRANGEMENT, AND METHOD FOR FABRICATING A SEMICONDUCTOR DEVICE

(71) Applicant: Infineon Technologies Austria AG, Villach (AT)

(72) Inventor: Gerardo Pantoja, Munich (DE)

(73) Assignee: Infineon Technologies Austria AG, Villach (AT)

( * ) Notice: Subject to any disclaimer, the term of this patent is extended or adjusted under 35 U.S.C. 154(b) by 345 days.

(21) Appl. No.: 18/607,902

(22) Filed: Mar. 18, 2024

(65) Prior Publication Data

US 2024/0332055 A1 Oct. 3, 2024

(30) Foreign Application Priority Data

Mar. 27, 2023 (DE) ......................... 102023202753.4

(51) Int. Cl.

| | |
|---|---|
| ***H10P 72/70*** | (2026.01) |
| ***B32B 3/04*** | (2006.01) |
| ***B32B 7/06*** | (2019.01) |
| ***B32B 7/14*** | (2006.01) |
| ***B32B 15/04*** | (2006.01) |
| ***B32B 15/20*** | (2006.01) |
| ***B32B 27/06*** | (2006.01) |
| ***B32B 37/12*** | (2006.01) |
| ***B32B 37/18*** | (2006.01) |
| ***H10P 72/00*** | (2026.01) |
| ***H10W 70/40*** | (2026.01) |
| ***H10W 74/10*** | (2026.01) |

(52) U.S. Cl.
CPC ................ *H10P 72/74* (2026.01); *B32B 3/04* (2013.01); *B32B 7/06* (2013.01); *B32B 7/14* (2013.01); *B32B 15/04* (2013.01); *B32B 15/20* (2013.01); *B32B 27/06* (2013.01); *B32B 37/1292* (2013.01); *B32B 37/18* (2013.01); *H10P 72/0442* (2026.01); *H10W 70/40* (2026.01); *H10W 74/111* (2026.01); *B32B 2307/206* (2013.01); *B32B 2307/7376* (2023.05); *B32B 2307/748* (2013.01); *B32B 2457/14* (2013.01)

(58) Field of Classification Search
None
See application file for complete search history.

(56) References Cited

FOREIGN PATENT DOCUMENTS

| | | | |
|---|---|---|---|
| EP | 3121210 A1 * | 1/2017 | .......... H10W 40/255 |
| WO | 2015141797 A1 | 9/2015 | |

* cited by examiner

*Primary Examiner* — Anthony Ho
(74) *Attorney, Agent, or Firm* — Murphy, Bilak & Homiller, PLLC

(57) ABSTRACT

A semiconductor device includes: at least one power semiconductor die; a substrate having a first side and an opposite second side, the at least one power semiconductor die being arranged over the first side; an encapsulation encapsulating the at least one power semiconductor die; a pre-cured lamination layer covering the second side of the substrate, the pre-cured lamination layer being exposed from the encapsulation and configured to provide electrical insulation for the substrate after curing; and a detachable foil covering the pre-cured lamination layer, the detachable foil being configured to be removed from the pre-cured lamination layer.

21 Claims, 4 Drawing Sheets

SEMICONDUCTOR DEVICE HAVING A DETACHABLE FOIL, POWER ELECTRONICS ARRANGEMENT, AND METHOD FOR FABRICATING A SEMICONDUCTOR DEVICE

TECHNICAL FIELD

This disclosure relates in general to a semiconductor device, in particular a semiconductor device comprising a detachable foil, as well as to a power electronics arrangement comprising a semiconductor device and to a method for fabricating a semiconductor device.

BACKGROUND

A semiconductor device, for example a semiconductor package or a semiconductor module, may comprise one or more semiconductor dies arranged on a substrate. The substrate may be configured to be coupled to a heatsink in order to dissipate heat generated by the semiconductor die(s) during operation. It may be desirable to provide electrical isolation between the semiconductor dies and the heatsink such that the heatsink is not at the potential of the semiconductor dies. Such an isolation can for example be provided by substrates with a built in isolation layer, e.g. a substrate of the type direct copper bond (DCB). However, among other things these types of substrate may be comparatively expensive and/or may increase the complexity of the fabrication process of the semiconductor device. Improved semiconductor devices, improved power electronics arrangements comprising semiconductor devices and improved methods for fabricating a semiconductor device may help in solving these and other problems.

SUMMARY

Various aspects pertain to a semiconductor device, comprising: at least one power semiconductor die; a substrate, preferably a leadframe part, comprising a first side and an opposite second side, wherein the power semiconductor die is arranged over the first side; an encapsulation encapsulating the power semiconductor die; a pre-cured lamination layer covering the second side of the substrate, the pre-cured lamination layer being exposed from the encapsulation and the pre-cured lamination layer being configured to provide electrical insulation for the substrate after curing; and a detachable foil covering the pre-cured lamination layer, the detachable foil being configured to be removed from the pre-cured lamination layer.

Various aspects pertain to a power electronics arrangement, comprising: a detachable foil; and a plurality of semiconductor packages or semiconductor modules arranged on the detachable foil and comprising: at least one power semiconductor die, a substrate, preferably a leadframe part, comprising a first side and an opposite second side, wherein the power semiconductor die is arranged over the first side, an encapsulation encapsulating the power semiconductor die, and a pre-cured lamination layer covering the second side of the substrate, the pre-cured lamination layer being exposed from the encapsulation and the pre-cured lamination layer being configured to provide electrical insulation for the substrate after curing, wherein the semiconductor packages or semiconductor modules are arranged on the detachable foil such that the detachable foil covers the pre-cured lamination layer, and wherein the detachable foil is configured to be removed from the pre-cured lamination layer.

Various aspects pertain to a method for fabricating a semiconductor device, the method comprising: providing at least one power semiconductor die, providing a substrate, preferably a leadframe part, comprising a first side and an opposite second side, wherein the power semiconductor die is arranged over the first side, providing an encapsulation encapsulating the power semiconductor die, laminating over the second side of the substrate with a pre-cured lamination layer such that the pre-cured lamination layer is exposed from the encapsulation, wherein the pre-cured lamination layer is configured to provide electrical insulation for the substrate after curing, and covering the pre-cured lamination layer with a detachable foil, the detachable foil being configured to be removed from the pre-cured lamination layer.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, structures and elements are shown in schematic form in order to facilitate describing one or more aspects of the disclosure. In this regard, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor device described below may use various types of semiconductor dies or circuits incorporated in the semiconductor dies, for example transistor structures in which at least one electrical contact pad is arranged on a first main face of the semiconductor die and at least one other electrical contact pad is arranged on a second main face of the semiconductor die, opposite to the first main face of the semiconductor die.

An efficient semiconductor device, an efficient method for fabricating a semiconductor device and an efficient power electronics assembly may for example reduce material consumption, ohmic losses, chemical waste, etc. and may thus enable energy and/or resource savings. Improved semiconductor devices, improved methods for fabricating a semiconductor device and improved power electronics assemblies, as specified in this description, may thus at least indirectly contribute to green technology solutions, i.e. climate-friendly solutions providing a mitigation of energy and/or resource use.

Figure 1:
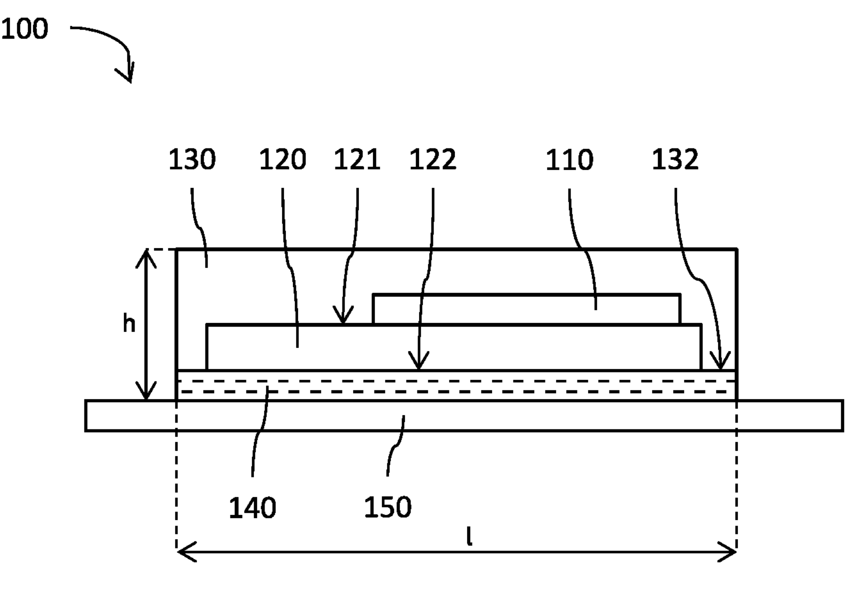
FIG. 1 shows a sectional view of a semiconductor device comprising a pre-cured lamination layer and a detachable foil covering the pre-cured lamination layer.

FIG. 1 shows a sectional view of a semiconductor device 100 which comprises at least one power semiconductor die 110, a substrate 120, an encapsulation 130, a pre-cured lamination layer 140 and a detachable foil 150.

The semiconductor device 100 may for example be a power semiconductor device configured to operate with a high electrical voltage and/or a high electrical current. The semiconductor device 100 may for example comprise a converter circuit, an inverter circuit, a half bridge circuit, a full bridge circuit, etc. The semiconductor device 100 may also be part of such a circuit, wherein several devices are connected to form the circuit. According to an example, the semiconductor device 100 is a discrete device and may for example be a semiconductor package. According to another example, the semiconductor device 100 is a semiconductor module.

The semiconductor device 100 may have any suitable dimensions. For example, the semiconductor device 100 may have a length 1 in the range of about 1 cm to about 30 cm. The lower limit of this range may also be about 2 cm, 3 cm or 5 cm and the upper limit may also be about 20 cm, 15 cm, 10 cm or 8 cm. The semiconductor device 100 may for example have a height h in the range of about 1 mm to about 5 cm. The lower limit of this range may also be about 2 mm, 3 mm, 4 mm, 5 mm or 6 mm and the upper limit may also be about 4 cm, 3 cm, 2 cm, 1 cm or 8 mm. The semiconductor device 100 may have a width (wherein the width is perpendicular to the length 1 and the height h) that is about equal to or smaller than the length 1.

The substrate 120 is preferably a leadframe part. However, the substrate 120 may also be of the type direct copper bonded (DCB), direct aluminum bonded (DAB), active metal brazed (AMB), insulated metal substrate (IMS), etc. The substrate 120 comprises a first side 121 and an opposite second side 122. The power semiconductor die 110 is arranged over the first side 110. The power semiconductor die 110, in particular a first power electrode on the lower side of the power semiconductor die 110, may be electrically and mechanically coupled to the first side 121 of the substrate 120, for example via a solder joint, sintered joint or via conductive glue. The semiconductor device 100 may for example comprise two power semiconductor dies 110, wherein first power electrodes of the two power semiconductor dies 110 are connected to each other via the substrate 120.

The encapsulation 130 encapsulates the power semiconductor die 110. According to an example, the encapsulation 130 comprises or consists of a molded body. According to another example, the encapsulation 130 comprises or consists of a frame, wherein the power semiconductor die 110 is arranged inside the frame and is covered by a suitable potting material. The frame may e.g. be a plastic frame or a metal frame. The encapsulation 130 may comprise or consist of any suitable polymer material or mold material and may also comprise inorganic filler particles configured to reduce the thermal resistance of the semiconductor device 100. A molded body may for example be fabricated using compression molding, injection molding or transfer molding.

The pre-cured lamination layer 140 covers the second side 122 of the substrate 120. The pre-cured lamination layer 140 may in particular cover the second side 122 of the substrate 120 completely and/or may be arranged directly on the second side 122 of the substrate 120. According to the example shown in FIG. 1, the pre-cured lamination layer 140 may also cover a second side 132 of the encapsulation 130. The layer 140 being "pre-cured" may mean that at least a part of the layer 140 has not been subjected to a curing process. For this reason, the pre-cured lamination layer 140 may comprise a solvent and/or be comparatively flexible and/or comparatively smooth. However, as described in greater detail further below, the pre-cured lamination layer 140 may comprise individual spots that have been cured.

The pre-cured lamination layer 140 is exposed from the encapsulation 130. For example, the encapsulation 130 might be arranged solely on one side of the pre-cured lamination layer 140. Furthermore, the pre-cured lamination layer 140 is configured to provide electrical insulation for the substrate 120 after a curing process has been performed on the pre-cured lamination layer. Such a curing process may for example comprise applying heat and/or radiation in order to cure the layer 140.

The pre-cured lamination layer 140 may comprise or consist of any suitable lamination material. For example, a lamination material with a comparatively low thermal resistance and/or a comparatively high electrical resistance may be used. The pre-cured lamination layer 140 may comprise a woven fabric and/or a thermoplastic and/or a thermosetting polymer. The pre-cured lamination layer 140 may in particular have a different material composition than the encapsulation 130, for example at least because the encapsulation 130 might not comprise or consist of a laminate.

The pre-cured lamination layer 140 may have any suitable dimensions. For example, the pre-cured lamination layer 140 may have a thickness in the range of about 50 μm to about 1 mm (the thickness being measured parallel to the height h of the semiconductor device 100). The lower limit of this range may also be about 100 μm, 150 μm or 200 μm and the upper limit may also be about 800 μm, 600 μm, 400 μm or 300 μm.

The pre-cured lamination layer 140 may for example have about the same length and width as the encapsulation 130. However, it is also possible that the length and/or the width of the pre-cured lamination layer 140 are e.g. 10% or more, or 20% or more, or 30% or more smaller or larger than the length and/or the width of the encapsulation 130.

The detachable foil 150 covers the pre-cured lamination layer 140. The detachable foil 150 may in particular cover the pre-cured lamination layer 140 completely. The detachable foil 150 may be arranged directly on the pre-cured lamination layer 140. The detachable foil 150 is configured to be removed from the pre-cured lamination layer 140, for example in order to arrange the semiconductor device 100 over a heatsink such that the layer 140 is in contact (in particular, in direct contact) with the heatsink. Arranging the semiconductor device 100 over such a heatsink may comprise curing the layer 140 in order to harden the layer 140 and/or to mechanically attach the semiconductor device 100 to the heatsink.

The detachable foil 150 may be configured to be removed from the pre-cured lamination layer 140 (e.g. to be peeled off of the pre-cured lamination layer 140) by automated equipment. The detachable foil 150 may comprise or consist of any suitable material. The detachable foil 150 may for example comprise or consist of a plastic, a polymer or a metal (e.g. Cu).

An adhesive force between the substrate 120 and the pre-cured lamination layer 140 may be greater than an adhesive force between the pre-cured lamination layer 140 and the detachable foil 150. This may for example be due to the detachable foil 150 having a smoother surface than the substrate 120 and/or due to the detachable foil 150 consisting of a suitable non-stick material or being covered with a suitable non-stick coating.

The detachable foil 150 may have any suitable dimensions. For example, the detachable foil 150 may have a thickness in the range of about 100 μm to about 5 mm. The lower limit of this range may also be about 200 μm, 300 μm or 500 μm and the upper limit may also be about 3 mm, 2 mm, 1 mm or 800 μm.

Figure 2:
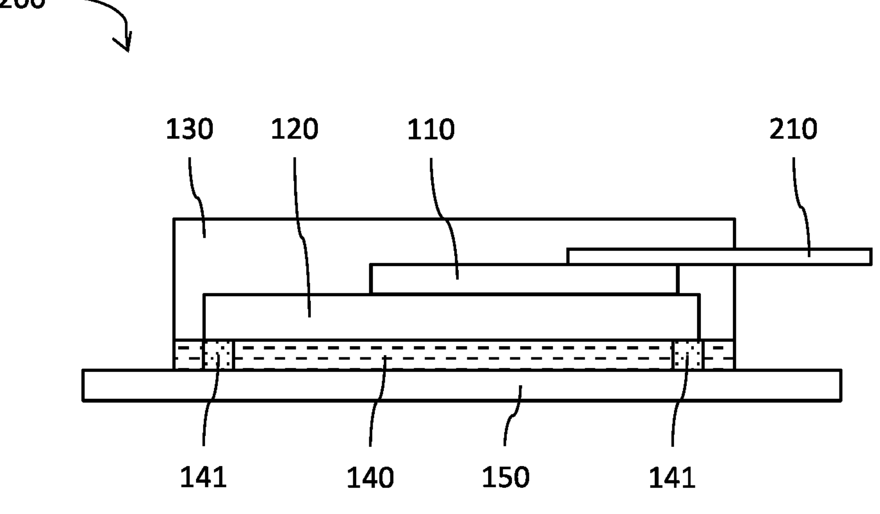
FIG. 2 shows a sectional view of a further semiconductor device, wherein the pre-cured lamination layer also comprises bonding spots with an increased adhesive force between a substrate, the pre-cured lamination layer and the detachable foil.

FIG. 2 shows a sectional view of a further semiconductor device 200 which may be similar or identical to the semiconductor device 100, except for the differences described in the following.

The semiconductor device 200 may comprise all components described with respect to FIG. 1 and it may additionally comprise one or more bonding spots 141 bonding the pre-cured lamination layer 140 to the second side 122 of the substrate 120. Furthermore, the one or more bonding spots 141 bond the detachable foil 150 to the pre-cured lamination layer 140. The one or more bonding spots 141 may for example comprise or consist of cured material of the pre-cured lamination layer 140.

Fabricating the semiconductor device 200 may comprise arranging the power semiconductor die 110, the substrate 120, the pre-cured lamination layer 140 and the detachable foil 150 on top of each other as shown in FIG. 2 and locally curing the pre-cured lamination layer 140 to generate the bonding spots 141.

The bonding spots 141 may comprise or consist of essentially the same material or material composition as the rest of the pre-cured lamination layer 140, except that the bonding spots 141 underwent a curing process. For this reason, the bonding spots 141 may for example be free or essentially free of any solvent present in the rest of the pre-cured lamination layer 140. The bonding spots 141 may be harder than the rest of the pre-cured lamination layer 140.

The curing process may cause the pre-cured lamination layer 140 to locally shrink at the bonding spots 141. For this reason, the pre-cured lamination layer 140 may have a reduced thickness at the bonding spots 141. The thickness may for example be reduced by 10% or more, or 30% or more, or 50% or more.

The one or more bonding spots 141 may have any suitable shape and any suitable dimensions. For example, the bonding spots 141 may have a size (a height, a diameter, a width . . . ) in the range of about 200 μm to about 5 mm. The lower limit of this range may also be about 400 μm, 600 μm or 800 μm and the upper limit may also be about 3 mm, 2 mm or 1 mm.

The bonding spots 141 may be arranged in any suitable manner, in particular in any suitable pattern, within the pre-cured lamination layer 140. For example, the bonding spots 141 may be arranged close to the four corners of the pre-cured lamination layer 140, along the edges of the pre-cured lamination layer 140, in the middle of the pre-cured lamination layer 140, etc. The semiconductor module 200 may comprise any suitable number of the bonding spots 141, e.g. one, two, three, four, five, etc.

The bonding spots 141 may account for a comparatively small part of the overall surface area of the pre-cured lamination layer 140. For example, the bonding spots 141 may account for 30% or less, or 20% or less, or 10% or less, or 5% or less of the overall surface area of the pre-cured lamination layer 140.

According to an example, an adhesive force (in particular, an adhesive force per surface area) between the substrate 120 and the pre-cured lamination layer 140 is at least two times greater in the one or more bonding spots 141 than an adhesive force between the substrate 120 and the pre-cured lamination layer 140 outside of the bonding spots 141.

According to an example, the semiconductor device 200 comprises one or more external contacts 210 electrically coupled to the one or more power semiconductor dies 110. The external contacts 210 may for example comprise or consist of leadframe parts. The external contacts 210 may for example be coupled to power electrodes of the power semiconductor dies 110.

Figure 3:
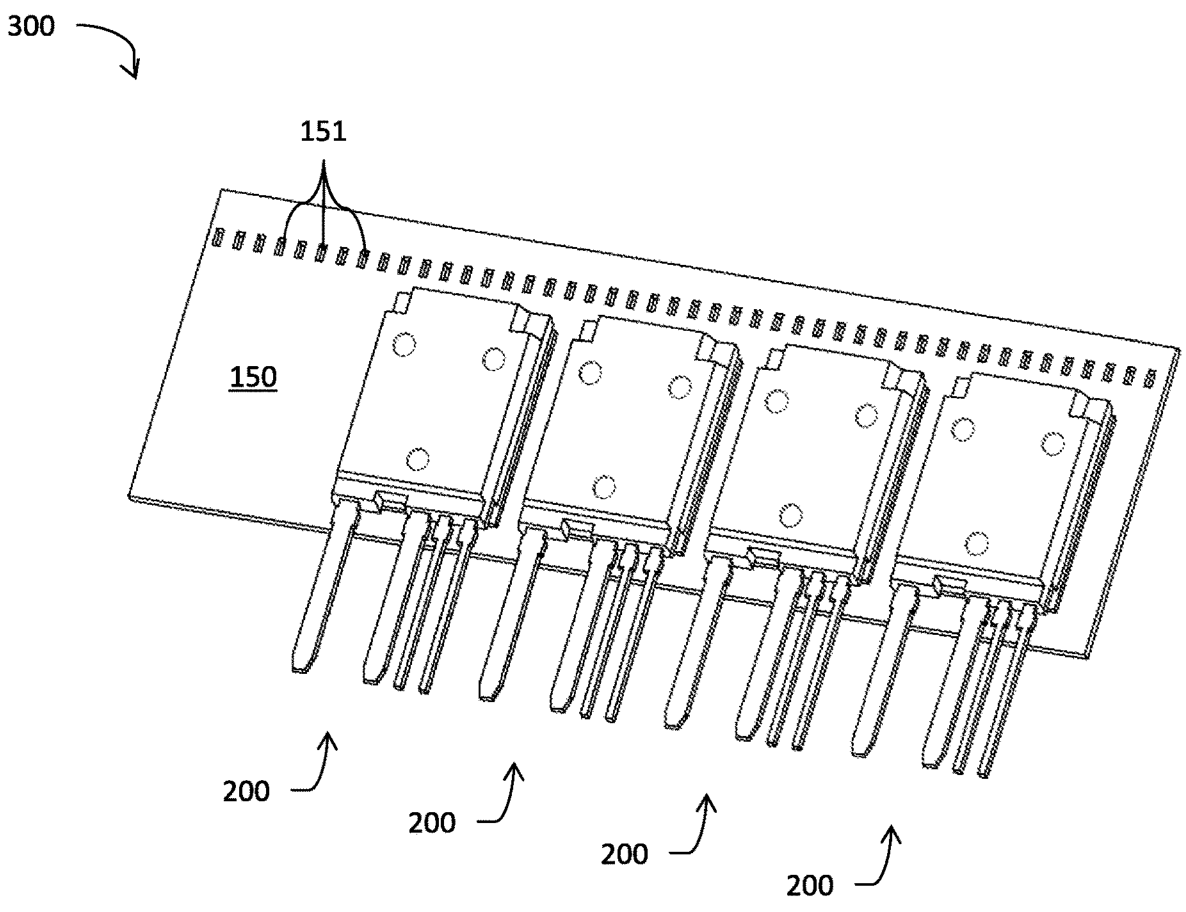
FIG. 3 shows a perspective view of a power electronics arrangement, wherein semiconductor packages or semiconductor modules are arranged on a detachable foil.

FIG. 3 shows a perspective view of a power electronics arrangement 300 which essentially comprises a plurality of semiconductor devices 200 with a common detachable foil 150. The power electronics arrangement 300 may also comprise the semiconductor devices 100. The power semiconductor arrangement 300 may comprise any number of semiconductor devices, e.g. two, three, four, . . . ten, . . . 50, etc.

As shown in FIG. 3, the detachable foil 150 may be a strip, in particular a strip configured to be handled by a pick-and-place-feeder. The semiconductor devices of the power electronics arrangement 300 may all be arranged on the same side of the detachable foil 150. The strip may comprise a trail of punctures 151 configured to interact with a cogwheel, e.g. a cogwheel of a pick-and-place feeder. The example of FIG. 3 shows a single trail of punctures 151 but the strip may of course also comprise e.g. two such trails.

FIGS. 4A to 4E show various stages of fabrication of a semiconductor device, according to an exemplary method for fabricating a semiconductor device.

Figure 4A:
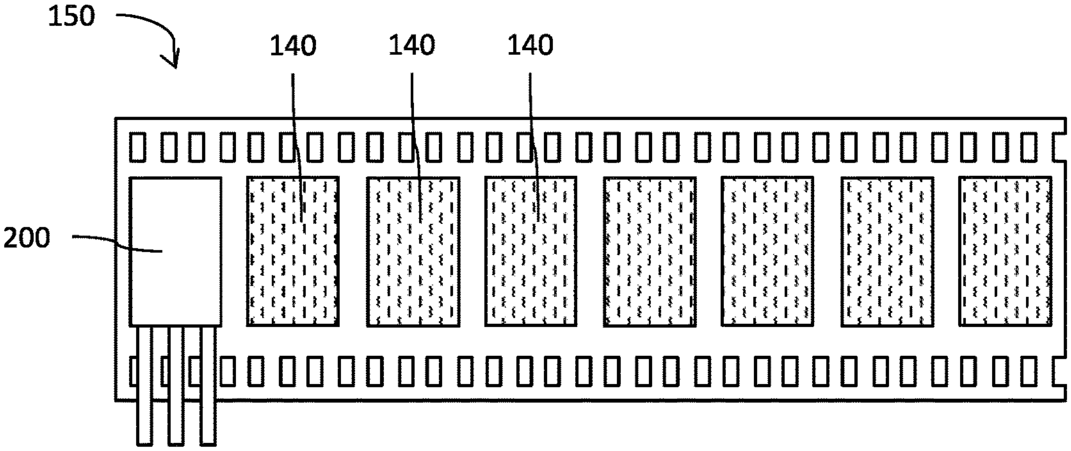
FIGS. 4A to 4E show a further semiconductor device, respectively a further power electronics arrangement, in various stages of fabrication.

As shown in the plan view of FIG. 4A, the detachable foil 150 may be provided. A plurality of preforms of pre-cured lamination layers 140 are arranged on the detachable foil 150. The rest of the semiconductor devices 100 or 200 may be arranged on the performs of the pre-cured lamination layers 140, for example by a pick-and-place process.

Figure 4B:
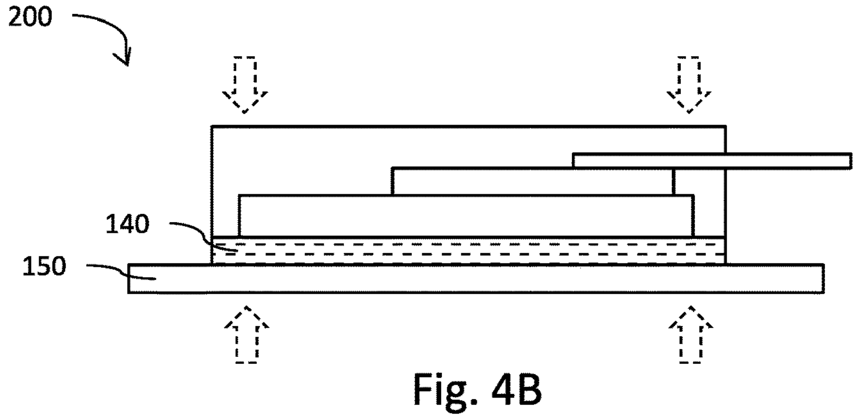

As shown in the sectional view of FIG. 4B, pressure and heat are applied to the pre-cured lamination layer 140 in order to generate the bonding spots 141. A tool comprising e.g. pins or ridges at the designated positions of the bonding spots 141 may be used to apply pressure and/or heat to the pre-cured lamination layer 140 in a localized manner.

Figure 4C:
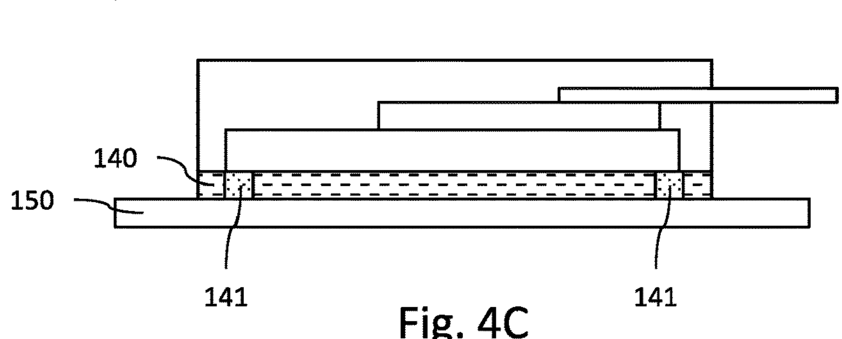

FIG. 4C shows a semiconductor device 200 after the bonding spots 141 have been formed. In this state, the bonding spots 141 tack the semiconductor package or semiconductor module onto the detachable foil 150. No further fixation means may be necessary and the semiconductor device 100 or 200, respectively the power electronics arrangement 300 may be safely handled, e.g. shipped, without contaminating or damaging the pre-cured lamination layer 140. The detachable foil 150 may in particular prevent the pre-cured lamination layer 140 from gathering dust which could negatively affect electrical isolation properties and/or mechanical attaching properties of the pre-cured lamination layer 140.

Figure 4D:
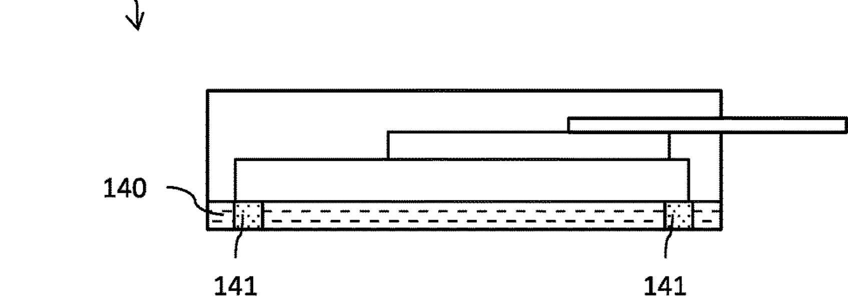

As shown in FIG. 4D, the detachable foil 150 may be removed to fabricate a semiconductor device 200'. The semiconductor device 200' may be identical to the semiconductor device 200, except for the lack of the detachable foil 150. The semiconductor device 200' may be configured to be attached to a carrier. Removing the detachable foil 150 may comprise peeling the detachable foil 150 off of the pre-cured lamination layer 140 or peeling the semiconductor device 200' off of the detachable foil 150. The detachable foil 150 may comprise one or more tabs configured to facilitate the peeling off of the detachable foil 150.

Figure 4E:
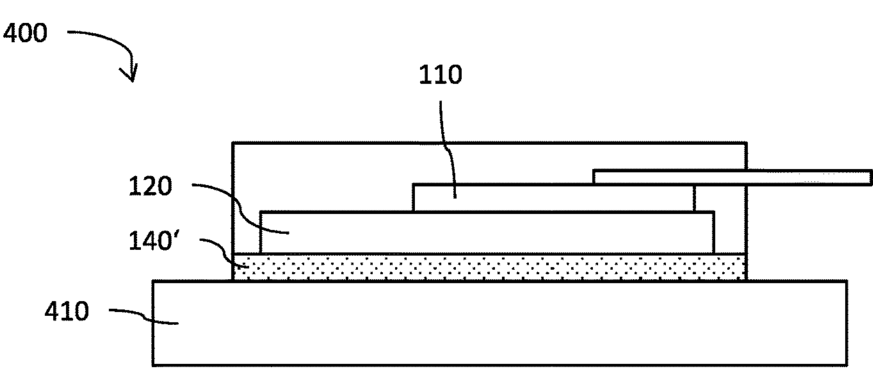

FIG. 4E shows a power electronics arrangement 400, wherein the semiconductor device 200' has been arranged on a carrier 410 and the layer 140 has been cured to fabricate the cured lamination layer 140'. The semiconductor device may be tacked to the carrier 410 by the cured lamination layer 140'. The carrier 410 may for example be a metal part and/or a heatsink. The cured lamination layer 140' may electrically isolate the substrate 120 as well as the power semiconductor die 110 from the carrier 410. For this reason, it may not be necessary to provide additional electrical isolation between the power semiconductor die 110 and the carrier 410. Therefore, the substrate 120 may e.g. be a comparatively cheap metal piece, e.g. a leadframe part, instead of e.g. a comparatively expensive DCB.

The bonding spots 141 may be configured to act as spacers providing a defined distance between the substrate 120 and the carrier 410 until the rest of the layer 140 has been cured. This may for example reduce or eliminate a tilt of the semiconductor device on the carrier 410.

Figure 5:
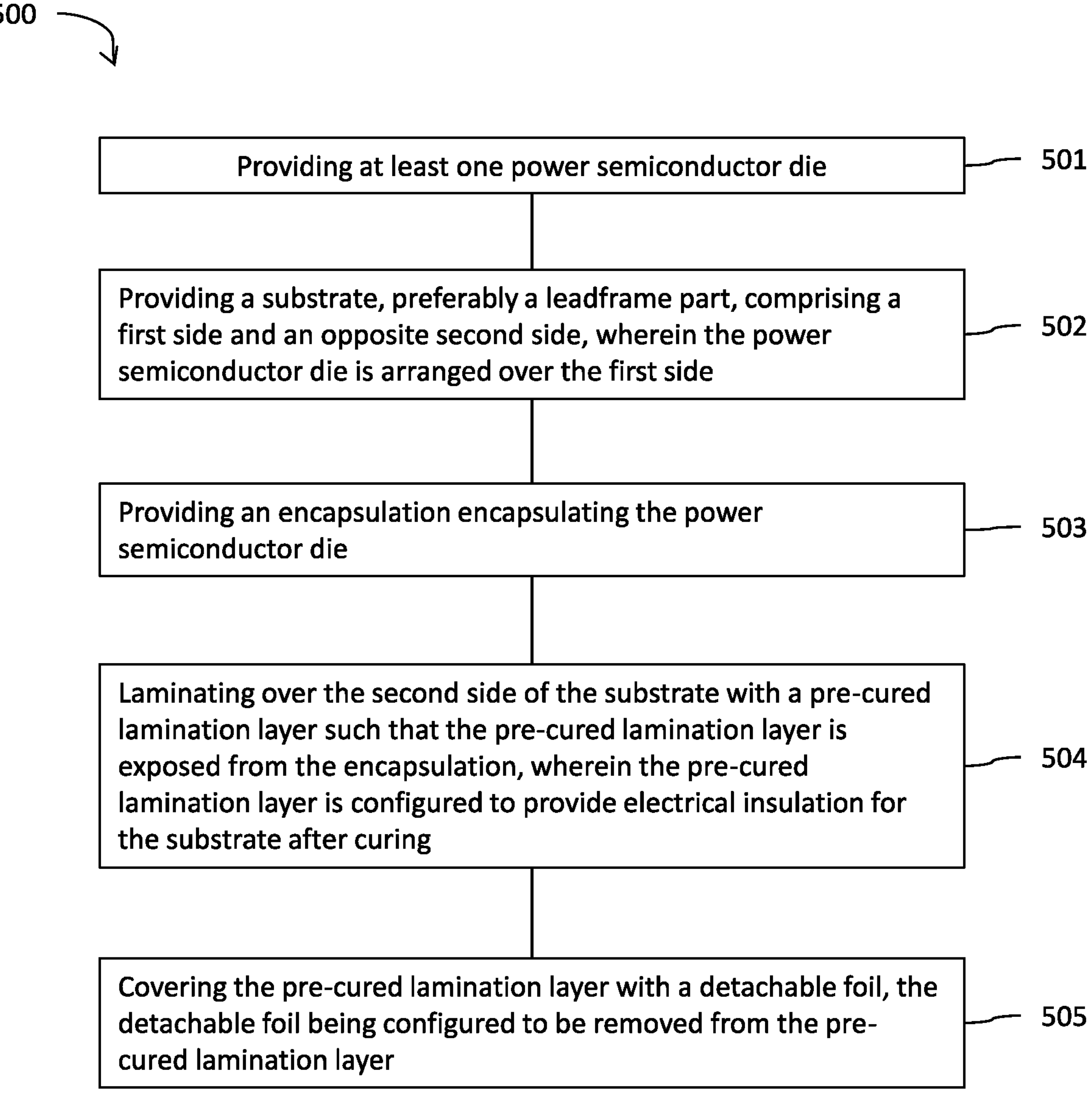
FIG. 5 is a flow chart of an exemplary method for fabricating a semiconductor device.

FIG. 5 is a flow chart of a method 500 for fabricating a semiconductor device. The method 500 may for example be used to fabricate the semiconductor device 100 or 200.

The method 500 comprises at 501 a process of providing at least one power semiconductor die, at 502 a process of providing a substrate, preferably a leadframe part, comprising a first side and an opposite second side, wherein the power semiconductor die is arranged over the first side, at 503 a process of providing an encapsulation encapsulating the power semiconductor die, at 504 a process of laminating over the second side of the substrate with a pre-cured lamination layer such that the pre-cured lamination layer is exposed from the encapsulation, wherein the pre-cured lamination layer is configured to provide electrical insulation for the substrate after curing, and at 505 a process of covering the pre-cured lamination layer with a detachable foil, the detachable foil being configured to be removed from the pre-cured lamination layer.

In the following, the semiconductor device, the method for fabricating a semiconductor device and the power electronics arrangement are further explained using specific examples.

Example 1 is a semiconductor device, comprising: at least one power semiconductor die, a substrate, preferably a leadframe part, comprising a first side and an opposite second side, wherein the power semiconductor die is arranged over the first side, an encapsulation encapsulating the power semiconductor die, a pre-cured lamination layer covering the second side of the substrate, the pre-cured lamination layer being exposed from the encapsulation and the pre-cured lamination layer being configured to provide electrical insulation for the substrate after curing, and a detachable foil covering the pre-cured lamination layer, the detachable foil being configured to be removed from the pre-cured lamination layer.

Example 2 is the semiconductor device of example 1, further comprising: one or more bonding spots bonding the pre-cured lamination layer to the second side of the substrate and the detachable foil to the pre-cured lamination layer, wherein the one or more bonding spots comprise or consist of cured material of the pre-cured lamination layer.

Example 3 is the semiconductor device of example 2, wherein the one or more bonding spots comprise 20% or less of the surface area of the pre-cured lamination layer.

Example 4 is the semiconductor device of example 2 or 3, wherein the one or more bonding spots are at least partially arranged at edges of the second side of the substrate.

Example 5 is the semiconductor device of one of examples 2 to 4, wherein an adhesive force between the substrate and the pre-cured lamination layer is at least two times greater in the one or more bonding spots than outside of the bonding spots.

Example 6 is the semiconductor device of one of examples 2 to 4, wherein the one or more bonding spots have a diameter in the range of 0.5 mm to 5 mm, in particular in the range of 1 mm to 2 mm.

Example 7 is the semiconductor device of one of the preceding examples, wherein the detachable foil is a strip configured to be handled by a pick-and-place-feeder.

Example 8 is the semiconductor device of example 7, wherein the strip comprises a trail of punctures configured to interact with a cogwheel.

Example 9 is the semiconductor device of one of the preceding examples, wherein the pre-cured lamination layer has a thickness in the range of 100 μm to 500 μm, in particular in the range of 200 μm to 300 μm.

Example 10 is the semiconductor device of one of the preceding examples, wherein the detachable foil comprises or consists of one or more of Cu and plastic.

Example 11 is the semiconductor device of one of the preceding examples, wherein an adhesive force between the substrate and the pre-cured lamination layer is greater than an adhesive force between the pre-cured lamination layer and the detachable foil.

Example 12 is a power electronics arrangement, comprising: a detachable foil; and a plurality of semiconductor packages or semiconductor modules arranged on the detachable foil and comprising: at least one power semiconductor die, a substrate, preferably a leadframe part, comprising a first side and an opposite second side, wherein the power semiconductor die is arranged over the first side, an encapsulation encapsulating the power semiconductor die, and a pre-cured lamination layer covering the second side of the substrate, the pre-cured lamination layer being exposed from the encapsulation and the pre-cured lamination layer being configured to provide electrical insulation for the substrate after curing, wherein the semiconductor packages or semiconductor modules are arranged on the detachable foil such that the detachable foil covers the pre-cured lamination layer, and wherein the detachable foil is configured to be removed from the pre-cured lamination layer.

Example 13 is the power electronics arrangement of example 12, wherein the semiconductor packages or semiconductor modules further comprise: one or more bonding spots bonding the pre-cured lamination layer to the second side of the substrate and the detachable foil to the pre-cured lamination layer, wherein the one or more bonding spots comprise or consist of cured material of the pre-cured lamination layer.

Example 14 is the power electronics arrangement of example 12 or 13, wherein the detachable foil is a strip configured to be handled by a pick-and-place-feeder.

Example 15 is the power electronics arrangement of example 15, wherein the strip comprises a trail of punctures configured to interact with a cogwheel.

Example 16 is a method for fabricating a semiconductor device, the method comprising: providing at least one power semiconductor die, providing a substrate, preferably a leadframe part, comprising a first side and an opposite second side, wherein the power semiconductor die is arranged over the first side, providing an encapsulation encapsulating the power semiconductor die, laminating over the second side of the substrate with a pre-cured lamination layer such that the pre-cured lamination layer is exposed from the encapsulation, wherein the pre-cured lamination layer is configured to provide electrical insulation for the substrate after curing, and covering the pre-cured lamination layer with a detachable foil, the detachable foil being configured to be removed from the pre-cured lamination layer.

Example 17 is the method of example 16, further comprising: bonding the pre-cured lamination layer to the second side of the substrate and the detachable foil to the pre-cured lamination layer by locally curing the pre-cured lamination layer at one or more bonding spots.

Example 18 is the method of example 17, wherein locally curing the pre-cured lamination layer comprises locally applying heat and pressure using pins or ridges.

Example 19 is the method of one of examples 16 to 18, wherein the pre-cured lamination layer is provided as a preform arranged on the detachable foil and wherein laminating over the second side of the substrate comprises placing the substrate onto the preform.

Example 20 is the method of one of examples 16 to 19, wherein the detachable foil is a strip configured to be handled by a pick-and-place-feeder.

Example 21 is an apparatus comprising means for performing the method according to anyone of examples 16 to 20.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor device, comprising:
at least one power semiconductor die;
a substrate comprising a first side and an opposite second side, wherein the at least one power semiconductor die is arranged over the first side;
an encapsulation encapsulating the at least one power semiconductor die;
a pre-cured lamination layer covering the second side of the substrate, the pre-cured lamination layer being exposed from the encapsulation and configured to provide electrical insulation for the substrate after curing; and
a detachable foil covering the pre-cured lamination layer, the detachable foil being configured to be removed from the pre-cured lamination layer.

2. The semiconductor device of claim 1, further comprising:
one or more bonding spots bonding the pre-cured lamination layer to the second side of the substrate and the detachable foil to the pre-cured lamination layer,
wherein the one or more bonding spots comprise cured material of the pre-cured lamination layer.

3. The semiconductor device of claim 2, wherein the one or more bonding spots comprise 20% or less of a surface area of the pre-cured lamination layer.

4. The semiconductor device of claim 2, wherein the one or more bonding spots are at least partially arranged at edges of the second side of the substrate.

5. The semiconductor device of claim 2, wherein an adhesive force between the substrate and the pre-cured lamination layer is at least two times greater in the one or more bonding spots than outside of the one or more bonding spots.

6. The semiconductor device of claim 2, wherein the one or more bonding spots have a diameter in a range of 0.5 mm to 5 mm.

7. The semiconductor device of claim 1, wherein the detachable foil is a strip configured to be handled by a pick-and-place-feeder.

8. The semiconductor device of claim 7, wherein the strip comprises a trail of punctures configured to interact with a cogwheel.

9. The semiconductor device of claim 1, wherein the pre-cured lamination layer has a thickness in a range of 100 μm to 500 μm.

10. The semiconductor device of claim 1, wherein the detachable foil comprises one or more of Cu and plastic.

11. The semiconductor device of claim 1, wherein an adhesive force between the substrate and the pre-cured lamination layer is greater than an adhesive force between the pre-cured lamination layer and the detachable foil.

12. The semiconductor device of claim 1, wherein the substrate is a leadframe part.

13. A power electronics arrangement, comprising:
a detachable foil; and
a plurality of semiconductor packages or semiconductor modules arranged on the detachable foil and comprising:
at least one power semiconductor die;
a substrate comprising a first side and an opposite second side, wherein the at least one power semiconductor die is arranged over the first side;

an encapsulation encapsulating the at least one power semiconductor die; and a pre-cured lamination layer covering the second side of the substrate, the pre-cured lamination layer being exposed from the encapsulation and configured to provide electrical insulation for the substrate after curing, wherein the semiconductor packages or semiconductor modules are arranged on the detachable foil such that the detachable foil covers the pre-cured lamination layer, wherein the detachable foil is configured to be removed from the pre-cured lamination layer.

14. The power electronics arrangement of claim 13, wherein the semiconductor packages or semiconductor modules further comprise:

one or more bonding spots bonding the pre-cured lamination layer to the second side of the substrate and the detachable foil to the pre-cured lamination layer, wherein the one or more bonding spots comprise cured material of the pre-cured lamination layer.

15. The power electronics arrangement of claim 13, wherein the detachable foil is a strip configured to be handled by a pick-and-place-feeder.

16. The power electronics arrangement of claim 15, wherein the strip comprises a trail of punctures configured to interact with a cogwheel.

17. A method for fabricating a semiconductor device, the method comprising:

providing at least one power semiconductor die;

providing a substrate comprising a first side and an opposite second side, wherein the at least one power semiconductor die is arranged over the first side;

providing an encapsulation encapsulating the at least one power semiconductor die;

laminating over the second side of the substrate with a pre-cured lamination layer such that the pre-cured lamination layer is exposed from the encapsulation, wherein the pre-cured lamination layer is configured to provide electrical insulation for the substrate after curing; and covering the pre-cured lamination layer with a detachable foil, the detachable foil being configured to be removed from the pre-cured lamination layer.

18. The method of claim 17, further comprising:

bonding the pre-cured lamination layer to the second side of the substrate and the detachable foil to the pre-cured lamination layer, by locally curing the pre-cured lamination layer at one or more bonding spots.

19. The method of claim 18, wherein locally curing the pre-cured lamination layer comprises locally applying heat and pressure using pins or ridges.

20. The method of claim 17, wherein the pre-cured lamination layer is provided as a preform arranged on the detachable foil, and wherein laminating over the second side of the substrate comprises placing the substrate onto the preform.

21. The method of claim 17, wherein the detachable foil is a strip configured to be handled by a pick-and-place-feeder.

* * * * *